United States Patent [19]

Zhang et al.

[11] Patent Number: 5,595,923
[45] Date of Patent: Jan. 21, 1997

[54] METHOD OF FORMING A THIN FILM TRANSISTOR

[75] Inventors: Hongyong Zhang; Hideki Uochi; Toru Takayama; Yasuhiko Takemura; Mutsuo Yamamoto, all of Kanagawa, Japan

[73] Assignee: Semiconductor Energy Laboratory Co., Ltd., Kanagawa-ken, Japan

[21] Appl. No.: 467,986

[22] Filed: Jun. 6, 1995

Related U.S. Application Data

[62] Division of Ser. No. 207,124, Mar. 8, 1994.

[30] Foreign Application Priority Data

| Mar. 12, 1993 | [JP] | Japan | 5-78999 |
| Mar. 12, 1993 | [JP] | Japan | 5-79000 |

[51] Int. Cl.$^6$ .................................................. H01L 21/84
[52] U.S. Cl. .............................. 437/41; 437/88; 437/233; 437/973; 148/DIG. 16
[58] Field of Search ................... 437/21, 233, 40 TFT, 437/41 TFT, 88, 967, 973; 148/DIG. 150, DIG. 16

[56] References Cited

U.S. PATENT DOCUMENTS

| 4,746,628 | 5/1988  | Takafuji et al. | 257/352     |
| 4,851,363 | 7/1989  | Troxell et al.  | 437/40 TFT  |
| 5,124,769 | 6/1992  | Tanaka et al.   | 257/366     |
| 5,147,826 | 9/1992  | Liu et al.      | 437/233     |
| 5,165,075 | 11/1992 | Hiraci et al.   | 359/59      |
| 5,275,851 | 1/1994  | Fonash et al.   | 427/578     |
| 5,403,772 | 4/1995  | Zhang et al.    | 257/66      |
| 5,501,989 | 3/1996  | Takayama et al. | 437/21      |

FOREIGN PATENT DOCUMENTS

| 2208635  | 8/1990 | Japan | 257/66 |
| 6-267978 | 9/1994 | Japan . |
| 6-267979 | 9/1994 | Japan . |
| 6-267988 | 9/1994 | Japan . |
| 6-275806 | 9/1994 | Japan . |
| 6-275807 | 9/1994 | Japan . |

OTHER PUBLICATIONS

C. Hayzelden et al., "In Situ Transmission Electron Microscopy Studies of Silicide–Mediated Crystallization of Amorphous Silicon" Appl. Phys. Lett. 60, 2 (1992) 225.

A. V. Dvurechenskii et al., "Transport Phenomena in Amorphous Silicon Doped by Ion Implantation of 3d Metals", Phys. Stat. Sol. A95 (1986) 635.

T. Hempel et al., "Needle–Like Crystallization of Ni Doped Amorphous Silicon Thin Films", *Solid State Communications*, vol. 85, No. 11, pp. 921–924, 1993.

*Primary Examiner*—Charles L. Bowers, Jr.
*Assistant Examiner*—Leon Radomsky
*Attorney, Agent, or Firm*—Sixbey, Friedman, Leedom & Ferguson, PC; Gerald J. Ferguson, Jr.; Jeffrey L. Costellia

[57] ABSTRACT

A substance containing a catalyst element is formed so as to closely contact with an amorphous silicon film, or a catalyst element is introduced into the amorphous silicon film. The amorphous silicon film is annealed at a temperature which is lower than a crystallization temperature of usual amorphous silicon, thereby selectively crystallizing the amorphous silicon film. The crystallized region is used as a crystalline silicon TFT which can be used in a peripheral driver circuit of an active matrix circuit. The region which remains amorphous is used as an amorphous silicon TFT which can be used in a pixel circuit. A relatively small amount of a catalyst element for promoting crystallization is added to an amorphous silicon film, and an annealing process is conducted at a temperature which is lower than the distortion temperature of a substrate, thereby crystallizing the amorphous silicon film. A gate insulating film, and a gate electrode are then formed, and an impurity is implanted in a self-alignment manner. A film containing a catalyst element for promoting crystallization is closely contacted with the impurity region, or a relatively large amount of a catalyst element is introduced into the impurity region by an ion implantation or the like. Then, an annealing process is conducted at a temperature which is lower than the distortion temperature of the substrate, thereby activating the doping impurity.

16 Claims, 5 Drawing Sheets

METHOD OF FORMING A THIN FILM TRANSISTOR

This is a divisional application of Ser. No. 08/207,124, filed Mar. 8, 1994.

BACKGROUND OF THE INVENTION

1. Field of the Invention

The invention relates to a thin film transistor (TFT) and a method of producing the same, and also to a semiconductor circuit having a plurality of thin film transistors (TFTs) and a method of producing the same. A thin film transistor produced in accordance with the invention may be formed on either of an insulating substrate such as glass, and a semiconductor substrate such as single crystal silicon. Particularly, the invention relates a semiconductor circuit comprising a matrix circuit which operates at a low speed, such as a monolithic active matrix circuit (which may be used in a liquid crystal display or the like), and a peripheral circuit which drives the active matrix circuit and operates at a high speed. The invention relates also to a thin film transistor which is produced by crystallization and activation according to thermal annealing.

2. Description of the Prior Art

Recently, researches are conducted on insulated gate semiconductor devices having a thin film active layer (also referred to as an active region). Particularly, thin film insulated gate semiconductor devices, or so-called thin film transistors (TFTs) are vigorously studied. Such thin film transistors are formed on a transparent insulating substrate so as to be used for controlling pixels or in a driver circuit in a liquid crystal display device, etc. having a matrix structure. Thin film transistors are classified into amorphous silicon TFTs and crystalline silicon TFTs, depending on the kind and crystal state of a used semiconductor material.

A semiconductor of an amorphous state has generally a low electric field mobility, and therefore cannot be used in a TFT which must operate at a high speed. Since P-type amorphous silicon has a very low electric field mobility, moreover, it is impossible to produce a P-channel TFT (PMOS TFT). Consequently, it is impossible to produce a complementary MOS circuit (CMOS) which consists of combinations of a P-channel TFT and an N-channel TFT (NMOS TFT).

In contrast, a crystalline semiconductor has a higher electric field mobility than that of an amorphous semiconductor, and therefore can operate at a high speed. When using crystalline silicon, since not only an NMOS TFT but also a PMOS TFT can be produced in the same manner, it is possible to produce a CMOS circuit. For example, a known liquid crystal display device of the active matrix type has a so-called monolithic structure in which not only the active matrix region but also a peripheral circuit (including a driver circuit, etc.) are constructed by CMOS crystalline TFTs. From these reasons, researches and developments on TFTs using crystalline silicon are vigorously conducted.

In an example of a method of obtaining crystalline silicon, amorphous silicon is crystallized by irradiating it with a laser or intense light equivalent to a laser. Because of instability of the laser output and instability due to a very short process period, however, this method offers no prospect for mass production or practical use.

Now, a method which may be practically employed is the one in which amorphous silicon is thermally crystallized. According to this method, it is possible to obtain crystalline silicon with reduced variation between batches. However, this method has a problem.

Generally, the formation of crystalline silicon requires annealing of a long period and at about 600° C., or annealing at a high temperature of 1,000° C. or higher. In the case where the latter method is employed, a selectable substrate is limited to one made of quartz, resulting in that the cost of a substrate is very high. In the case where the former method is employed, a substrate can be selected from a wide range, but there arises another problem.

When an inexpensive alkalifree glass substrate (for example, No. 7059 produced by Corning Co. Ltd.) is used, a conventional process of producing a TFT is roughly conducted in the following manner:

(1) formation of an amorphous silicon film;

(2) crystallization of the amorphous silicon film (600° C. or higher, and 24 hours or longer);

(3) formation of a gate insulating film;

(4) formation of a gate electrode;

(5) Introduction of doping impurities (by the ion implantation method or ion doping method);

(6) activation of the doping impurities (600° C. or higher, and 24 hours or longer);

(7) formation of a layer insulator; and (8) formation of source and drain electrodes.

In the process, steps (2) and (8) have problems. Many kinds of alkalifree glass have a distortion temperature of about 600° C. (593° C. in the case of Corning 7059). Therefore, a process at such a temperature causes problems such as a shrinkage and bend of a substrate. In step (2) which is a first annealing process, a shrinkage of a substrate does not cause a serious problem because a patterning process has not yet been conducted. In step (6), however, a patterning process has been conducted already. When the substrate shrinks in step (6), therefore, the mask alignment in the following steps cannot be properly conducted, thereby forming a major cause for impairing the yield. Consequently, it is desired to conduct the process of step (2) at a temperature lower than the distortion temperature of the substrate, and to conduct the process of step (6) at a further lower temperature (preferably, at a temperature lower than the distortion temperature of glass by 50° C. or lower, and, more preferably, at a temperature lower than the maximum process temperature of step (2) by 50° C or lower).

In order to meet the requirements, a method in which a laser or the like is used as described above may be employed. In addition to the problem of instability of a laser output, however, it was observed there arises another problem in that a stress is generated owing to a difference in temperature rise between the portion to which a laser beam is irradiated (the source and drain regions) and that to which a laser beam is not irradiated (the active region, i.e., the region below the gate electrode), thereby impairing the reliability.

On the other hand, a TFT made of an amorphous semiconductor has a feature that the OFF current is low. Therefore, such a TFT is employed in a use such as a transistor for a pixel circuit of an active matrix of a liquid crystal display device which does not require a very high operation speed, in which only a single conductivity type is sufficient, and which requires a TFT having a high ability of retaining charges. However, such a TFT cannot be employed in a peripheral circuit which must operate at a high speed.

In a crystalline silicon TFT, a leak current flowing when no voltage is applied to the gate (i.e., during the nonselected period) is larger than that in an amorphous silicon TFT. When a crystalline silicon TFT is to be used in a liquid crystal display device, measures that an auxiliary capacitor for compensating the leak current is disposed, and that two TFTs are connected in series are taken so as to reduce the leak current.

Figure 5:
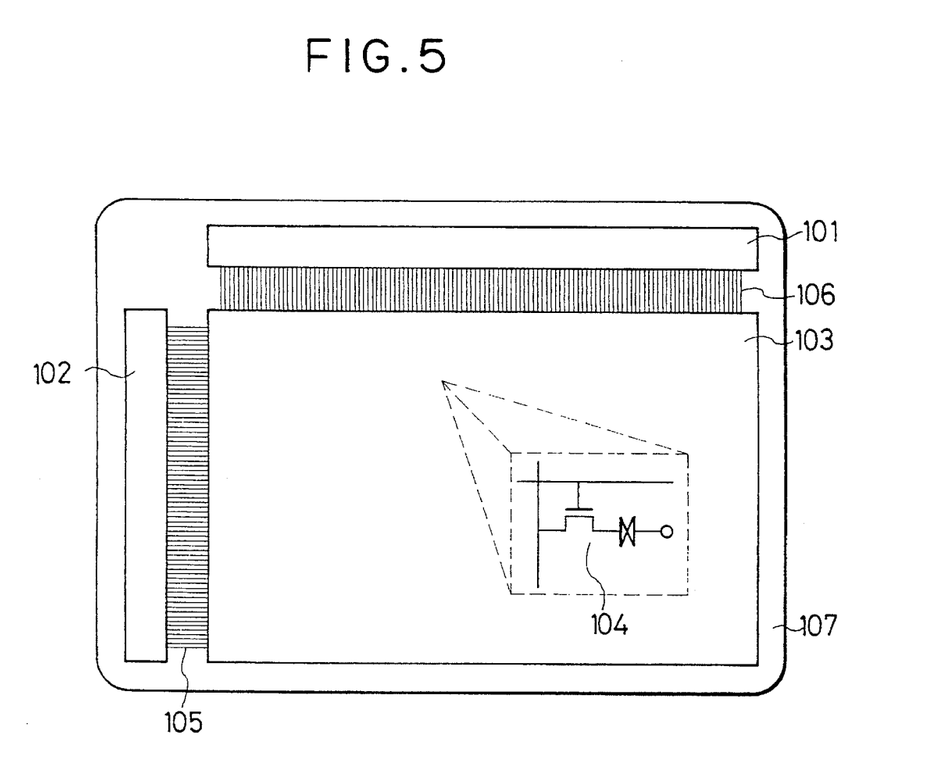
FIG. 5 is a diagram showing an example of a monolithic active matrix circuit.

FIG. 5 shows a block diagram of an active matrix circuit used in a liquid crystal display device. As peripheral circuits, a column decoder 101 and a row decoder 102 are disposed on a substrate 107. Pixel circuits 104 each consisting of a transistor and a capacitor are formed in a matrix region 103. The matrix region and the peripheral circuits are connected to each other through wirings 105 and 106. TFTs used in the peripheral circuits are required to have a property of a high speed, and TFTs used in the pixel circuits are required to have a property of a low leak current. Although these properties are physically contradictory to each other, it is required to form the both kinds of TFTs on the same substrate and by the same process.

Generally, the formation of crystalline silicon requires annealing of a long period and at about 600° C., or annealing at a high temperature of 1,000° C. or higher. For example, it is impossible to construct a structure in which a high OFF resistance of amorphous silicon TFTs is utilized and these TFTs and a peripheral circuit consisting of polysilicon TFTs which have a high mobility are formed on the same substrate, because amorphous silicon is crystallized in the above-mentioned annealing process.

SUMMARY OF THE INVENTION

In the view point of mass production, therefore, it is difficult to employ the method using a laser in the production of a TFT. On the other hand, it is the state of the art that no other effective method cannot be found. The invention has been conducted in order to solve these difficult problems. It is an object of the invention to solve the problems while maintaining the mass productivity.

The invention has been conducted in order to solve these difficult problems. However, it is not desirable that an improved configuration produces a complicated process, a lowered yield, and an increased cost. It is an object of the invention to allow two kinds of TFTs, i.e., TFTs in which a high mobility is required, and TFTs in which a low leak current is required, to be selectively produced in an easy manner by changing the process at a minimum while maintaining the mass productivity.

The result of study of this inventor made clear that addition of a catalytic material of a small amount to an amorphous silicon film enhanced crystallization, lowered temperature of crystallization, and shortened time of crystallization. As the catalytic material, simple substance like nickel (Ni), iron (Fe), cobalt (Co), platinum (Pt), or compound such as silicide thereof is appropriate. Concretely, the amorphous silicon film can be crystallized by forming a film, grain, or cluster having these catalytic elements under or on the amorphous silicon film, or by introducing these catalytic elements in the amorphous silicon film by a method like ion injection; followed by thermally annealing the amorphous silicon film at an appropriate temperature, typically at 580° C. or less.

In the case of forming an amorphous silicon film by a chemical vapor deposition method (CVD method), these catalysts can be added in a material gas; in the case of forming an amorphous silicon film by a physical gas phase method like sputtering, these catalysts can be added in a deposition material like target or deposition source. Though it is a natural result, the higher the temperature of annealing is, the shorter the time of crystallization is. Moreover, the higher the concentration of nickel, iron, cobalt, platinum is, the lower the temperature of crystallization is and the shorter the time of crystallization is. By the study of this inventor, to enhance crystallization, it was found that concentration of at least one element should be $1\times10^{17}$ cm$^{-3}$ or more, preferably $5\times10^{18}$ cm$^{-3}$ or more.

Furthermore, what should be noticed is that a region which does not have catalytic material like this does not enhance crystallization at all, and can keep condition of amorphous. For example, crystallization of amorphous with concentration of $1\times10^{17}$ cm$^{-3}$ or less, preferably $1\times10^{16}$ cm$^{-3}$ or less, starts at 600° C. or more, but is not enhanced at all at 580° C. or less. However, because hydrogen needed in neutralizing dangling bonds in amorphous silicon is released in an atmosphere of 300° C. or more, it is desirable that annealing is performed in hydrogen atmosphere to obtain appropriate semiconductor character.

In the present invention, characteristic of crystallization with above mentioned catalytic material is utilized to form an amorphous silicon film. A part of it is selectively crystallized and is utilized as crystal silicon TFT in a peripheral circuit of an active matrix circuit. Another part in amorphous condition is utilized as amorphous silicon TFT in a matrix region (pixel circuit). As a result, a circuit having transistor with contradicting characters of low leak current and fast action can be formed simultaneously on the same substrate.

Because either of above mentioned catalytic material is a material undesirable for silicon, it is desirable that concentration of them is as low as possible. In the study of this inventor, to utilize it particularly as an active region, it is desirable that concentration of these catalytic material is not more than $10^{20}$ cm$^{-3}$ in total, in order to obtain satisfactory reliability and characteristics. On the other hand, it was made clear that even if relatively a lot of catalytic material exists in source, drain and the like, that is not a problem.

This inventor found that above mentioned problems can be solved by taking attention to the effect of this catalytic element and by utilizing it. Manufacturing process of TFT of this invention is briefly as the following:

1) Deposition of an amorphous silicon film
1') Introduction of a catalytic element (by an ion injection or an ion doping method)
2) Crystallization of amorphous silicon film (at 600° C or less, within 8 hours)
3) Deposition of a gate insulating film
4) Formation of a gate electrode
5) Introduction of doping impurities (by an ion injection or an ion doping method)
5') Deposition of a material having catalytic element to a silicon film
6) Activation of a doping impurity (600° C. or less, within 8 hours)
7) Formation of interlayer insulator
8) Formation of source, drain electrode or, 1) Deposition of an amorphous silicon film
1') Introduction of a catalytic element (by an ion injection or an ion doping method)
2) Crystallization of an amorphous silicon film (600° C. or less, within 8 hours)
3) Deposition of a gate insulating film
4) Formation of a gate electrode 5) Introduction of a doping impurity (by an ion injection or an ion doping method)

5') Introduction of a catalytic element (by ion injection or an ion doping method)

6) Activation of a doping impurity (600° C. or less, within 8 hours)

7) Formation of an interlayer insulator

8) Formation of source, drain electrode

In the processes of these, order of 5) and 5') can be reversed. The process of 1') can be replaced as "A process of adhering a film and the like having catalytic element on or under an amorphous silicon film". From the standpoint of controlling concentration of catalytic element precisely, a method like ion injection is desirable. However, from the standpoint of simplifying processes and suppressing plant investment, if characteristic of TFT obtained is satisfactory, such process can be utilized.

In the present invention, the catalytic element introduced to an amorphous silicon film by said process 1') enhances its crystallization a lot. On the other hand, the catalytic element introduced mainly to the source, drain region by 5') enhances recrystallization of that region a lot. Therefore, for crystallization and activation, temperature of 600° C. or less, typically 550° C. or less is enough. Time of annealing within 8 hours, typically within 4 hours is enough, too. Especially if the catalytic element is initially distributed equally by an ion injection method or an ion doping method, crystallization was very easy to proceed.

In this invention, because s gate electrode exists on an active region by adopting either process, the catalytic element will not be adhered or injected to an active region directly in the process of 5'). Therefore, it is possible to change concentration of catalytic element in an active region and an impurity region. For example, by relatively decreasing concentration of catalytic element to be added to an active region, bad effect to be given to characteristic and reliability of TFT is reduced to the utmost. By increasing concentration of catalytic element to be added to an impurity region relatively and lowering temperature of activation, shrinkage and distortion of the substrate is suppressed and yield can be increased. Reliability and characteristic of TFT is rarely lost.

In the present invention, an amorphous silicon film with thickness of 1000 Å or less is also crystallized by the cause of catalytic element. Such amorphous silicon film will not be crystallized by the usual heat annealing. From the standpoint of preventing pinhole and defects of insularity in the step portion of TFT, and preventing disconnection of a gate electrode of the gate electrode, thickness of the crystal silicon film is demanded as 1000 Å or less, preferably 500 Å or less. This is not achieved by a method other than laser crystallization, but the present invention achieved this by heat annealing even at a low temperature. This naturally contributes to further improvement of yield. The present invention will be explained more in detail further, by utilizing embodiments.

DESCRIPTION OF THE PREFERRED EMBODIMENTS

[Embodiment 1]

FIG. 1 is a section view showing steps of the production process conducted in the embodiment. First, a foundation film 11 made of silicon oxide and of a thickness of 2,000 Å was formed on a substrate (Corning 7059) 10 by the sputtering method. Then, an intrinsic (I-type) amorphous silicon film 12 was deposited by the plasma CVD method in a thickness of 500 to 1,500 Å, for example, 1,500 A. Nickel ions were implanted into the amorphous silicon film by the ion implantation method in a dose of $1 \times 10^{13}$ to $5 \times 10^{14}$ cm$^{-2}$, for example, $5 \times 10^{13}$ cm$^{-2}$ As a result nickel ions existed in a concentration of about $5 \times 10^{18}$ cm$^{-3}$ in the amorphous silicon film (FIG. 1(A)).

Next, an annealing process in an atmosphere of nitrogen was conducted at 550° C. for 4 hours to crystallize the silicon film. Then, the silicon film was patterned to form a silicon island region 13. As a gate insulating film, a silicon oxide film 14 of a thickness of 1,000 Å was deposited by the sputtering method. In this sputtering process, silicon oxide was used as a target, and the substrate temperature was 200° to 400° C., for example, 250° C. The sputtering process was conducted in an atmosphere of oxygen and argon in which the ratio of argon to oxygen was 0 to 0.5, for example, 0.1 or less.

Thereafter, a silicon film (containing 0.1 to 2% of phosphorus) was deposited by the reduced pressure CVD method in a thickness of 3,000 to 8,000 Å, for example, 6,000 Å. It is preferable to conduct in succession the steps of forming the silicon oxide and the silicon film. The silicon film was then patterned to form a gate electrode 15 (FIG. 1(B)).

Then, an impurity (phosphorus) was implanted into the silicon region as a mask by the plasma doping method with using the gate electrode. In this process, phosphine (PH$_3$) was used as a doping gas, the acceleration voltage was 60 to 90 kV, for example, 80 kV and the dose was $1 \times 10^{15}$ to $8 \times 10^{15}$ cm$^{-2}$ for example, $\times 10^{15}$ cm$^{-2}$. As a result N-type impurity regions and 16b were formed (FIG. 1(C)).

Figure 1A:
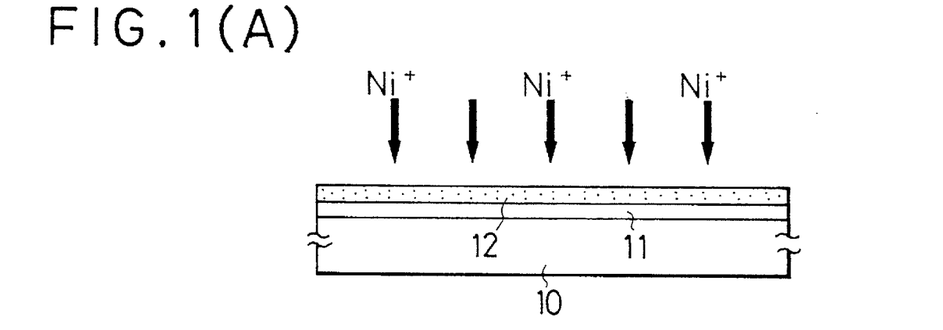
FIGS. 1(A) to 1(E) are section views showing steps of the production process conducted in Embodiment 1.
Figure 1B:
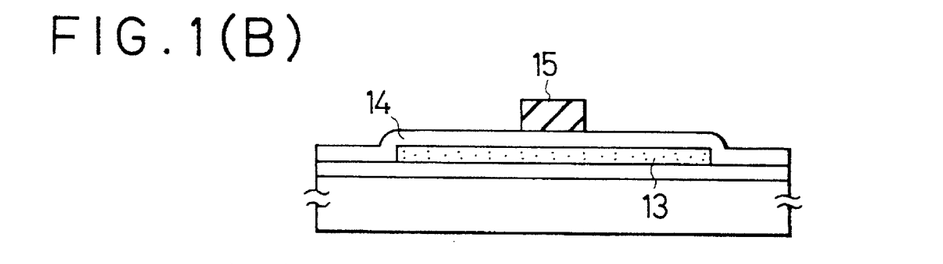
Figure 1C:
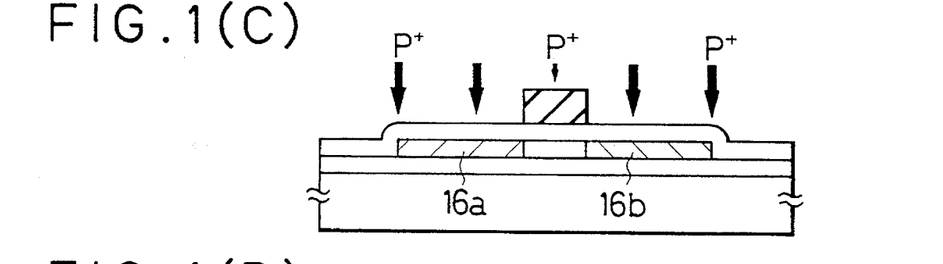
Figure 1D:
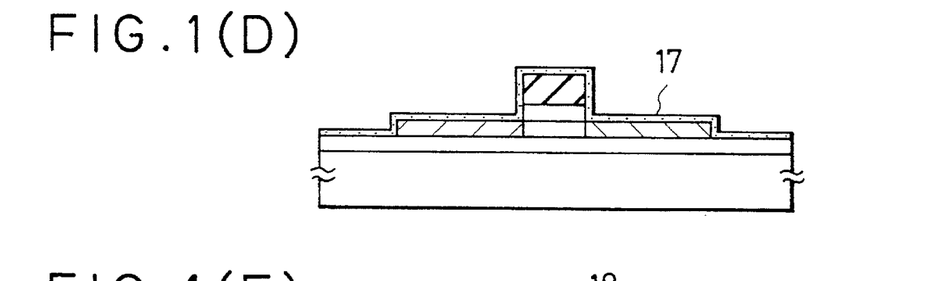
Figure 1E:
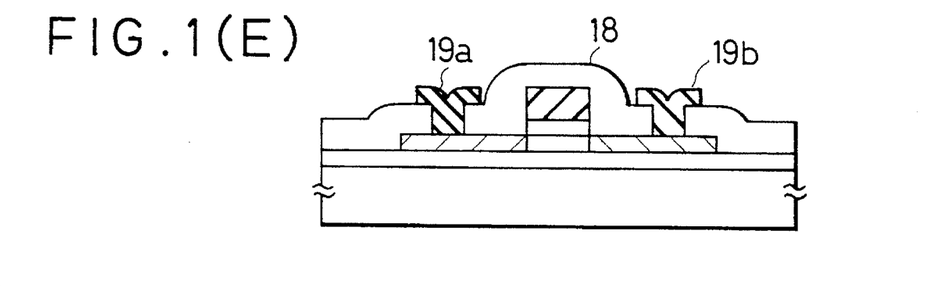

Next, the silicon oxide film 14 on the impurity regions was etched away to expose the impurity regions 16. By the sputtering method, a nickel silicide film (having the formula of NiSi$_x$ wherein $0.4 \leq x \leq 2.5$, for example, x=2.0) 17 was uniformly formed in a thickness of 5 to 200 Å, for example, 20 Å on the whole area as shown in FIG. 1(D). When the film was formed in such a reduced thickness of about 20 Å, it was not continuous, and exhibited an outlook of an aggregate of particles. However, these did not cause any problem in the embodiment (FIG. 1(D)).

Thereafter, in an atmosphere of nitrogen, an annealing process was conducted for 4 hours at a temperature of 480° C. (which is lower by 70° C. than that of the above-mentioned crystallizing process), thereby activating the impurity. In this annealing process, first, nickel diffused into the N-type impurity regions 16a and 16b from the nickel silicide film covering the impurity regions. Therefore, the annealing caused the recrystallization to easily progress. In this way, the impurity regions 16a and 16b were activated.

Then, a silicon oxide film 18 of a thickness of 6,000 Å was formed as a layer insulator by the plasma CVD method, and contact holes were formed in the insulator. Electrodes/ wirings 19a and 19b were formed in the source and drain regions of a TFT by a multilayer film of metal materials such as titanium nitride and aluminum. Finally, in an atmosphere of hydrogen of 1 atm., an annealing process was conducted at 350° C. for 30 minutes. As a result of the above-mentioned process, a thin film transistor was completed (FIG. 1(E)).

The concentration of nickel in the active region (the region below the gate electrode) of the thus produced TFT was measured by the secondary ion mass spectrometry (SIMS), with the result that it was about $1\times10^{18}$ to $5\times10^{18}$ cm$^{-3}$ The concentration of nickel in the impurity regions 16 was about $1\times10^{19}$ to $\times10^{19}$ cm$^{-3}$.

[Embodiment 2]

FIG. 2 is a section view showing steps of the production process conducted in the embodiment. First, a foundation film 21 made of silicon oxide and of a thickness of 2,000 Å was formed on a substrate (Corning 7059) 20 by the sputtering method. Then, an intrinsic (I-type) amorphous silicon film 22 was deposited by the plasma CVD method in a thickness of 500 to 1,500 Å, for example, 1,500 Å, and a silicon oxide film 23 of a thickness of 200 Å was deposited by the sputtering method. Nickel ions were implanted into the amorphous silicon film by the ion implantation method in a dose of $5\times10^{13}$ cm$^{-2}$ (FIG. 2A)).

Next, an annealing process in an atmosphere of nitrogen was conducted on the amorphous silicon film at 550° C. for 8 hours to crystallize the amorphous silicon film. Thereafter, the silicon film was patterned to form a silicon island region 24.

Using tetraethoxysilane (Si(OC$_2$H$_5$)$_4$, TEOS) and oxygen as materials, a silicon oxide film 25 of a thickness of 1,000 Å was formed by the plasma CVD method as a gate insulating film of a crystalline silicon TFT. In addition to these material gases, trichloroethylene (C$_2$HCl$_3$) was further used as one of the materials. Before the film formation, 400 SCCM of oxygen was passed through a chamber, and plasma was generated under the conditions that the substrate temperature was 300° C., the total pressure was 5 Pa, and the RF power was 150 W. This state was maintained for 10 minutes. Thereafter, 300 SCCM of oxygen, 15 SCCM of TEOS, and 2 SCCM of trichloroethylene were introduced into the chamber to conducted the film formation of the silicon oxide film. In this film formation, the substrate temperature, the RF power, and the total pressure were 300° C., 75 W, and 5 Pa, respectively. After the completion of the film formation, hydrogen of 100 Torr was introduced into the chamber, and hydrogen annealing was conducted at 350° C. for 35 minutes.

Thereafter, a tantalum film was deposited by the sputtering method in a thickness of 3,000 of 8,000 Å, for example, 6,000 Å. In place of tantalum, titanium, tungsten, molybdenum, or silicon may be used. However, the material is required to have sufficient heat resisting properties so that it can withstand the subsequent activation process. It is preferable to conduct in succession the steps of forming the silicon oxide 25 and the tantalum film. Then, the tantalum film was patterned to form a gate electrode 26 of a TFT. The surface of the tantalum wiring was anodically oxidized to form an oxide layer 27 thereon The anodic oxidation was conducted in a 1 to 5% ethylene glycol solution of tartaric acid. The obtained oxide layer had a thickness of 2,000 Å (FIG. 2(B).

By the plasma doping method, an impurity (phosphorus) was then implanted into the silicon region with using the gate electrode as a mask. In this process, phosphine (PH$_3$) was used as a doping gas, the acceleration voltage was 80 kV, and the dose was $2\times10^{15}$ cm$^{-2}$. As a result, N-type impurity regions 28a and 28b were formed. Because of the anodic oxide, the gate electrode 26 was displaced from the impurity regions 28 (FIG. 2(C)).

Using the gate electrode as a mask, nickel ions were implanted into the silicon region by the ion implantation method in a dose of $1\times10^{14}$ to $2\times10^{15}$ cm$^{-2}$ for example, $5\times10^{14}$ cm$^{-2}$. As a result the concentration the N-type impurity regions 28a and 28b were about $5\times10^{19}$ cm$^{-3}$ (FIG. 2(D)).

Figure 2A:
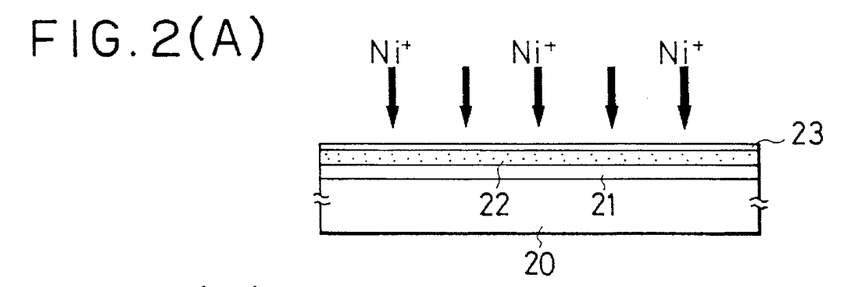
FIGS. 2(A) to 2(E) are section views showing steps of the production process conducted in Embodiment 2.
Figure 2B:
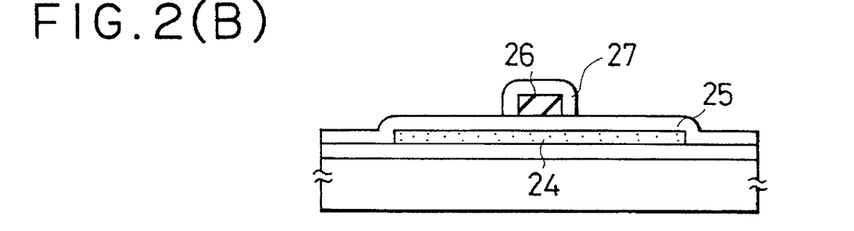
Figure 2C:
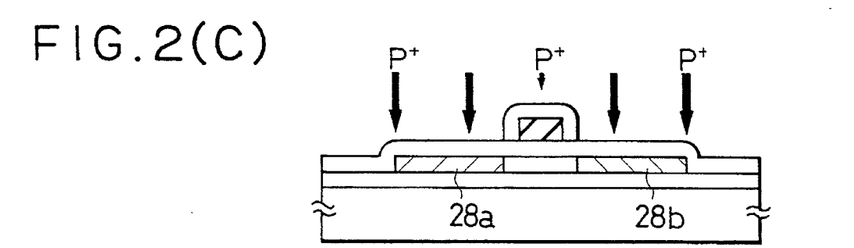
Figure 2D:
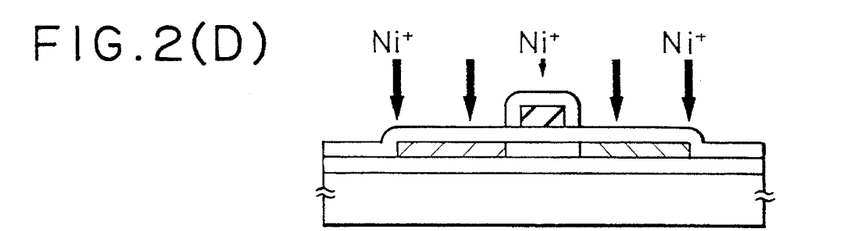
Figure 2E:
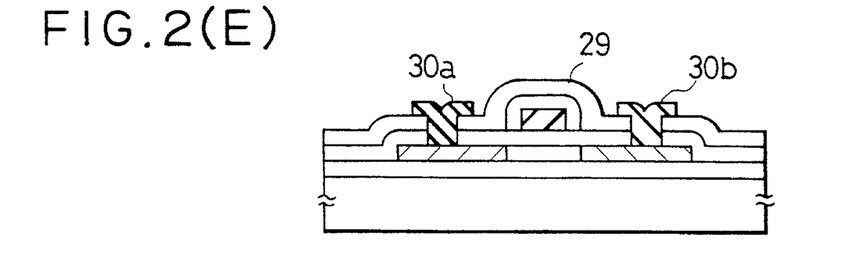
Figure 3A:
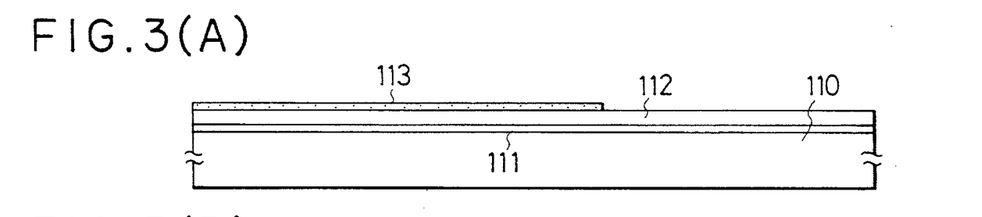
FIGS. 3(A) to 3(E) are section views showing steps of the production process conducted in Embodiment 3.
Figure 3B:
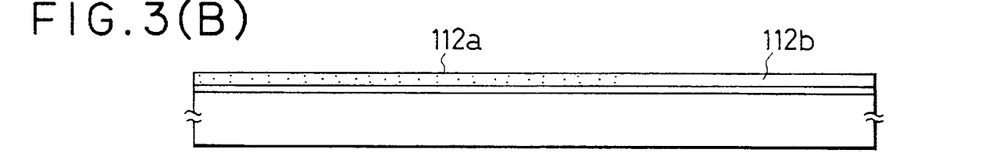
Figure 3C:
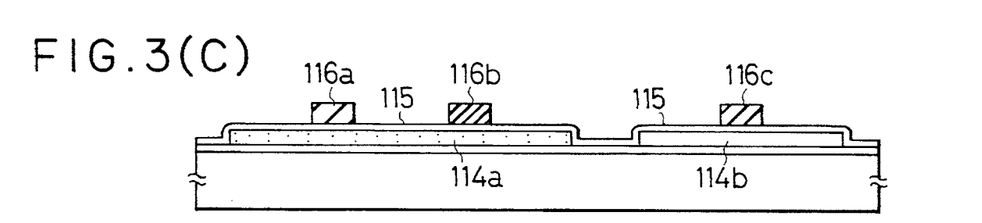
Figure 3D:
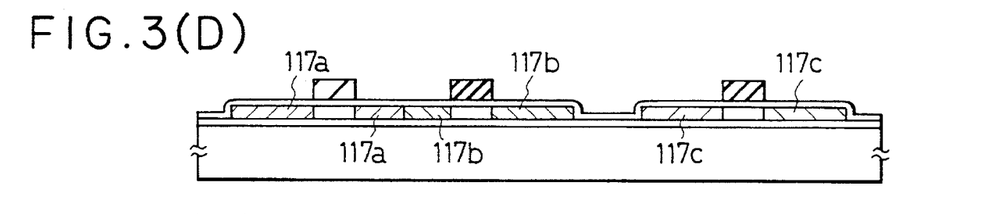
Figure 3E:
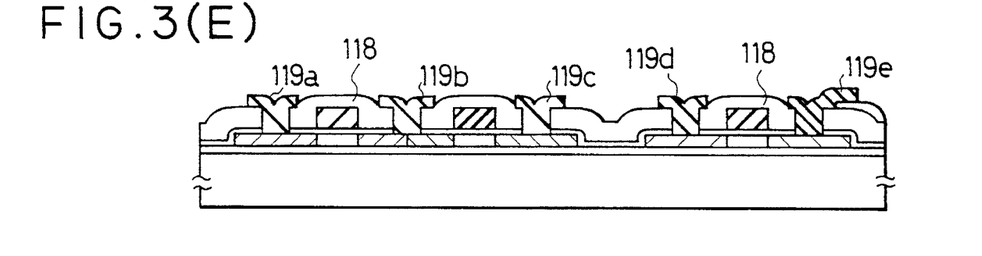
Figure 4A:
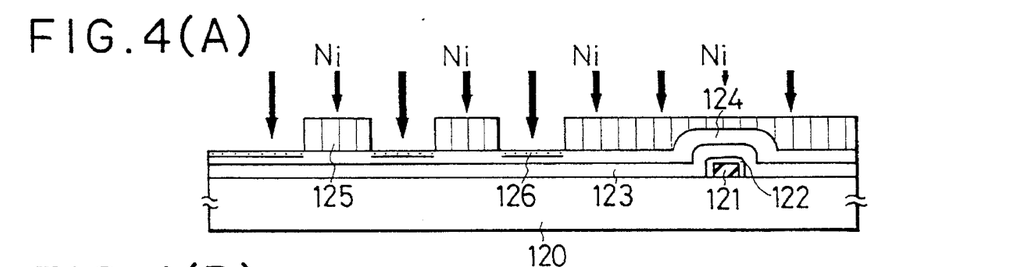
FIGS. 4(A) to 4(E) are section views showing steps of the production process conducted in Embodiment 4.
Figure 4B:
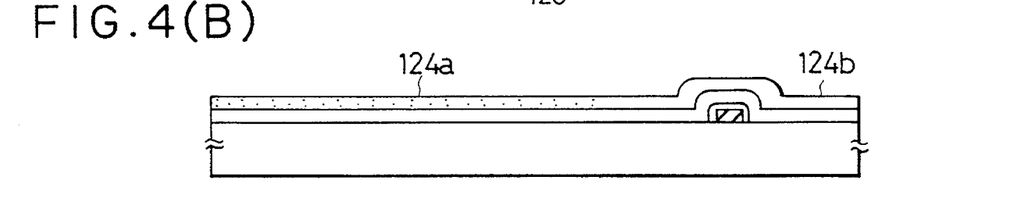
Figure 4C:
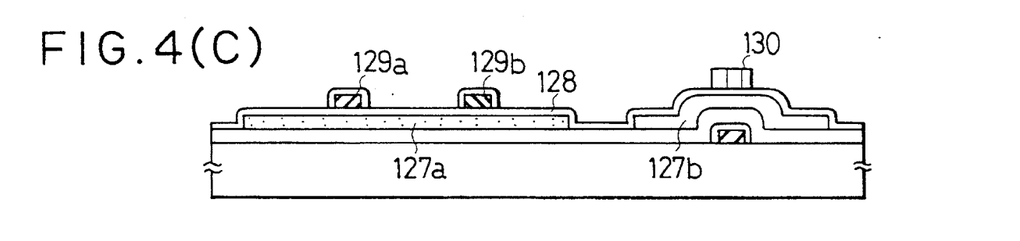
Figure 4D:
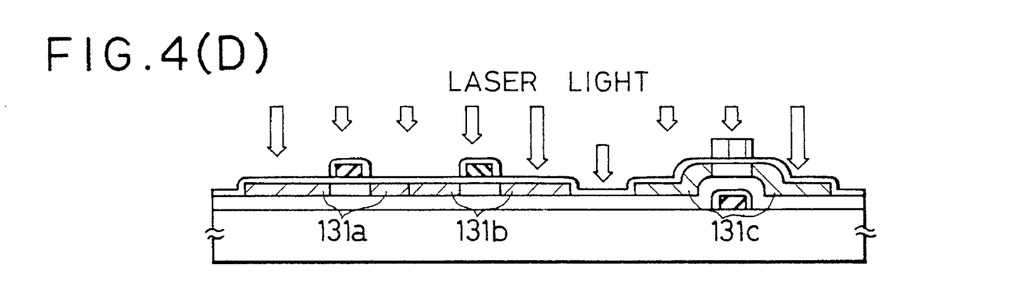
Figure 4E:
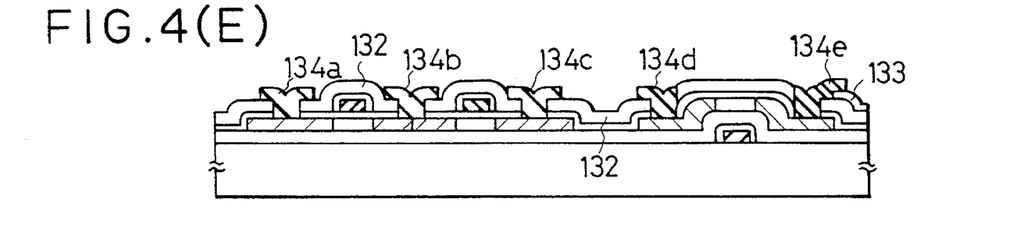

Thereafter, in an atmosphere of nitrogen, an annealing process was conducted for 4 hours at 450° C., thereby activating the impurity. In this annealing process, since nickel ions were implanted into the N-type impurity regions 28a and 28b, the annealing caused the recrystallization to easily progress. In this way, the impurity regions 28a and 28b were activated.

Then, a silicon oxide film 29 of a thickness of 2,000 Å was formed as a layer insulator by the plasma CVD method in which TEOS was used as a material, and contact holes were formed in the insulator. Source and drain electrodes/wirings 30a and 30b were formed by a multilayer film of metal materials such as titanium nitride and aluminum. As a result of the above-mentioned process, a semiconductor circuit was completed (FIG. 2(E)).

In the thus produced thin film transistor, the field effect mobility was 70 to 100 cm$^2$/Vs at a gate voltage of 10 V, the threshold voltage was 2.5 to 4.0 V, and the leak current was $10^{-13}$ A or less when a voltage of −20 V was applied to the gate. [Embodiment 3]

in the embodiment, crystalline silicon TFTs and an amorphous silicon TFT were formed on the same substrate by a substantially same process. FIG. 3 is a section view showing steps of the production process conducted in the embodiment. First, a foundation film 111 made of silicon oxide and of a thickness of 2,000 Å was formed on a substrate (Corning 7059) 110 by the sputtering method. Then, an intrinsic (I-type) amorphous silicon film 112 was deposited by the plasma CVD method in a thickness of 500 to 1,500 Å, for example, 1,500 Å, and in succession a nickel silicide film (having the formula of NiSi$_x$ wherein $0.4 \leq x \leq 2.5$, for example, x =2.0) 113 was selectively formed by the sputtering method in a thickness of 5 to 200 Å, for example, 20 Å (FIG. 3(A)).

Then, in an atmosphere of hydrogen reduction (preferably, the partial pressure of hydrogen is from 0.1 to 1 atm.), an annealing process was conducted at 500° C. for 4 hours to perform crystallization. As a result, the amorphous silicon film below the nickel silicide film 113 was crystallized to become a crystalline silicon film 112a. In contrast, the silicon film in the region where the nickel silicide film did not exist remained in the amorphous state as indicated by 112b (FIG. 3(B)).

The thus obtained silicon film was patterned by the photolithography method to form a silicon island region 114a (crystalline silicon region) and another silicon island region 114b (amorphous silicon region). As a gate insulating film, a silicon oxide film 115 of a thickness of 1,000 Å was deposited by the sputtering method. In this sputtering process, silicon oxide was used as a target, and the substrate temperature was 200° to 400° C., for example, 350° C. The sputtering process was conducted in an atmosphere of oxygen and argon in which the ratio of argon to oxygen was 0 to 0.5, for example, 0.1 or less. Thereafter, a silicon film (containing 0.1 to 2% of phosphorus) was deposited by the reduced pressure CVD method in a thickness of 6,000 to 8,000 Å, for example, 6,000 Å. It is preferable to conduct in succession the steps of forming the silicon oxide and the silicon film. The silicon film was then patterned to form gate electrodes 118a, 118b and 118c (FIG. 3(C)).

Then, impurities (phosphorus and boron) were implanted into the silicon region by the plasma doping method with using the gate electrodes as a mask. In this process, phosphine ($PH_3$) and diborane ($B_2H_6$) were used as doping gases, the acceleration voltage was 60 to 90 kV, for example, 80 kV in the case of the former and 40 to 80 kV, for example, 65 kV in the case of the latter, and the dose was $1\times10^{15}$ to $8\times10^{15}$ cm$^{-2}$, for example, $2\times10^{15}$ cm$^{-2}$ for phosphorus and $5\times10^{15}$ cm$^{-2}$ for boron. As a result, a P-type impurity region 117a and N-type impurity regions 117b and 117c were formed. In this case, after the doping of phosphorus, nickel was doped in a dose of $1\times10^{13}$ to $1\times10^{15}$cm$^{-2}$ for example $5\times10^{14}$ cm$^{-2}$ (FIG. 3(D)).

Then, in an atmosphere of hydrogen reduction, an annealing process was conducted at 500° C. for 4 hours to activate the impurities. In this process, since nickel ions were diffused in the region 114a which was previously crystallized, the annealing caused the recrystallization to easily progress. Also in the silicon island region 114b, since also nickel was doped in the phosphorus-doped region 117c, crystallization was sufficiently conducted even in the annealing of such a degree. In this way, the impurity regions 117a to 117c were activated. The active region of the amorphous silicon TFT was not crystallized because no nickel existed in the region. Then, a silicon oxide film 118 of a thickness of 6,000 Å was formed as a layer insulator by the plasma CVD method, and contact holes were formed in the insulator Electrodes/ wirings 119a, 119b and 119c for the crystalline silicon TFTs and electrodes/wirings 119d and 119e for the amorphous silicon TFT were formed by a multilayer film of metal materials such as titanium nitride and aluminum. Finally, in an atmosphere of hydrogen of 1 atm., an annealing process was conducted at 350° C. for 30 minutes. As a result of the above-mentioned process, a semiconductor circuit was completed (FIG. 3(E)).

The concentration of nickel in the active region of each of thus obtained TFTs was measured by the secondary ion mass spectrometry (SIMS), with the result that, in the crystalline silicon TFTs, nickel ions of $1\times10^{18}$ to $5\times10^{18}$ cm$^{-3}$ were observed, but the concentration of nickel in the amorphous silicon TFT was less than the measurement limit ($1\times10^{16}$ cm$^{-3}$).

[Embodiment 4]

In the embodiment, crystalline silicon TFTs were used in a peripheral driver circuit, and an amorphous silicon TFT was used in a pixel circuit. FIG. 4 is a section view showing steps of the production process conducted in the embodiment. By the sputtering method, a tantalum film was formed on a substrate (Corning 7059) 120 in a thickness of 500 to 2,000 Å, for example, 1,000 Å. The tantalum film was patterned to form a gate electrode wiring 121 for the amorphous silicon TFT. In the periphery of the tantalum wiring, an anodic oxide film 122 of a thickness of 1,000 to 3,000 Å, for example, 1,500 Å was formed by the anodic oxidation.

Next, a silicon oxide film 123 of a thickness of 2,000 Å was formed by the sputtering method. The silicon oxide film 123 functions as a gate insulating film of the amorphous silicon TFT and also as a foundation insulating film for the crystalline silicon TFTs. Thereafter, an amorphous silicon film 124 was deposited by the plasma CVD method in a thickness of 200 to 1,500 Å, for example, 500 Å. While masking the amorphous silicon film 124 by a photoresist 125, nickel ions were implanted into the silicon film by the ion implantation method, so that a region containing nickel of $1\times10^{18}$ to $2\times10^{19}$ cm$^{-3}$, for example, $5\times10^{18}$ cm$^{-3}$ was produced.

The depth of the region 128 was 200 to 500 Å. The acceleration energy was selected in the optimum manner so as to accomplish the depth. Nickel ions were prevented from being implanted into the region functioning as the active region in the crystalline silicon TFTs. The channel length was 20μor less, preferably 10 μm or less. When the channel length was greater than this value, it was impossible to crystallize the whole of the active region (FIG. 4(A)).

Then, in an atmosphere of hydrogen of 0.1 to 1 atm., an annealing process was conducted at 550° C. for 8 hours to perform crystallization. As a result of the crystallizing process, the regions into which nickel were implanted, the regions interposed between the nickel implanted regions, and their periphery (these regions are indicated by 124a in FIG. 4(B)) were also crystallized. As a result of the annealing at 550° C. for 8 hours, the crystallization laterally proceeded over about 10 μm. In contrast, the region 124b where nickel had not been implanted remained in the amorphous state (FIG. 4(B)).

The silicon film was patterned to form a silicon island region 127a (crystalline silicon region) and another silicon island region 127b (amorphous silicon region). As a gate insulating film of the crystalline silicon TFTs, a silicon oxide film 128 of a thickness of 1,000 Å was formed by the plasma CVD method in which tetraethoxysilane ($Si(OC_2H_5)_4$, TEOS) and oxygen were used as materials. In addition to these material gases, trichloroethylene ($C_2HCl_3$) was further used as one of the materials. Before the film formation, 400 SCCM of oxygen was passed through a chamber, and plasma was generated under the conditions that the substrate temperature was 300° C., the total pressure was 5 Pa, and the RF power was 150 W. This state was maintained for 10 minutes. Thereafter, 300 SCCM of oxygen, 15 SCCM of TEOS, and 2 SCCM of trichloroethylene were introduced into the chamber to conduct the film formation of the silicon oxide film. In this film formation, the substrate temperature, the RF power, and the total pressure were 300° C., 75 W, and 5 Pa, respectively. After the completion of the film formation, hydrogen of 100 Torr was introduced into the chamber, and hydrogen annealing was conducted at 350° C. for 35 minutes.

Thereafter, an aluminum film (containing 2% of silicon) was deposited by the sputtering method in a thickness of 6,000 to 8,000 Å, for example, 6,000 Å. In place of aluminum, tantalum, titanium, tungsten, or molybdenum may be used. It is preferable to conduct in succession the steps of forming the silicon oxide 128 and the aluminum film. Then, the aluminum film was patterned to form gate electrodes 129a and 129b of the TFTs. The surfaces of the aluminum wirings were anodically oxidized to form oxide layers thereon. The anodic oxidation was conducted in a 1 to 5% ethylene glycol solution of tartaric acid. The obtained oxide layers had a thickness of 2,000 Å. By conducting an exposure from the back of the substrate, a photoresist mask 130 was formed on the silicon oxide of the amorphous silicon TFT in a self-alignment manner with respect to the gate electrode 121 (FIG. 4(C)).

By the plasma doping method, an impurity (phosphorus) was then injected into the silicon region with using the gate electrode as a mask. In this process, phosphine ($PH_3$) was used as a doping gas, the acceleration voltage was 60 to 90 kV, for example 80 kV and the dose was $1\times10^{15}$ to $8\times10^{15}$ cm$^{-2}$ for example, $2\times10^{15}$ cm$^{-2}$. As a result, N-type impurity regions 131a and 131c were formed. Thereafter, the crystalline silicon TFT (N-channel TFT) in the left side and the amorphous silicon TFT (matrix region) were masked by a photoresist, and an impurity (boron) was implanted into the silicon region of the crystalline silicon TFT (P-channel TFT) in the right side. In this process, diborane ($B_2H_6$) was used as a doping gas, and the acceleration voltage was 50 to 80 kV, for example, 65 kV. The dose was $1\times10^{15}$ to $8\times10^{15}$ cm$^{-2}$ for example, $5\times10^{15}$ cm$^{-2}$ which is greater than that of phosphorus which was previously implanted. In this way, a P-type impurity region 131b was formed.

Thereafter, the impurities were activated by the laser annealing method. As a laser, a KrF excimer laser (wavelength: 248 nm, pulse width: 20 nsec.) was used. Alternatively, another laser such as an XeF excimer laser (wavelength: 353 nm), an XeCl excimer laser (wavelength: 308 nm), or an ArF excimer laser (wavelength: 193 nm) may be used. The energy density of the laser was 200 to 400 mJ/cm$^2$, for example 250 mJ/cm$^2$, and each point was irradiated with 2 to 10 shots, for example, 2 shots of the laser. The substrate may be heated to about 200° to 450° C. during the irradiation of the laser. In the case where the substrate is heated, it should be paid attention that the optimum energy density varies depending on the temperature. The active region of the amorphous silicon TFT was not crystallized because the mask 130 existed thereon. As a result, the impurity regions 131a and 131b of the crystalline silicon TFTs and the impurity region of the amorphous silicon TFT were activated (FIG. 4(D)).

Then, a silicon oxide film 132 of a thickness of 2,000 Å was formed as a layer insulator by the plasma CVD method in which TEOS was used as a material. An indium tin oxide (ITO) film of a thickness of 500 to 1,000 Å, for example, 800 Å was deposited by the sputtering method. The ITO film was etched to form a pixel electrode 133. Contact holes were formed in the layer insulator 132. Source and drain electrodes/wirings 134a, 134b and 134c for the crystalline silicon TFTs (peripheral driver circuit) and electrodes/wirings 134d and 134e for the amorphous silicon TFT (pixel circuit) were formed by a multilayer film of metal materials such as titanium nitride and aluminum. As a result of the above-mentioned process, a semiconductor circuit was completed (FIG. 4(E)).

In the produced semiconductor circuit, the properties of the crystalline silicon TFTs (peripheral driver circuit) were not inferior to those of TFTs which were produced by steps of conducting a conventional crystallization process of annealing at 600° C. For example, it was confirmed that a shift register produced by the embodiment operated at 11 MHz under a drain voltage of 15 V and at 16 MHz under a drain voltage of 17 V. Also in tests of reliability, any difference between the shift register and that of the prior art could not be found.

With respect to the properties of the amorphous silicon TFT (pixel circuit), the leak current was $10^{-13}$ A or less.

According to the invention, since crystallization of amorphous silicon, and activation of doping impurities in silicon are conducted at a low temperature such as 400° to 550° C. and for a short period such as 4 hours, the throughput can be improved. When a process of 600° C. or higher is employed, conventionally, there arises a problem in that a shrinkage of a glass substrate causes the yield to be impaired. According to the invention, such a problem can be easily solved.

This means that a large-size substrate can be processed at one time. In other words, when a large-size substrate is processed, many semiconductor circuits (matrix circuits, etc.) can be cut out from one substrate, whereby the unit cost can be reduced largely. When this feature is applied to a liquid crystal display device, it is possible to promote the mass productivity and improve the properties. As described above, the invention is very beneficial in the industry.

Furthermore, according to the invention, a crystalline silicon TFT which can operate at a high speed, and an amorphous silicon TFT which is characterized in a low leak current can be formed on the same substrate by the same process. When this feature is applied to a liquid crystal display device, it is possible to enhance the mass productivity and improve the properties.

What is claimed is:

1. A method of forming a transistor comprising:

forming on a substrate a semiconductor film comprising silicon;

adding a catalyst element for promoting crystallization, to said semiconductor film;

annealing the semiconductor film at a first temperature to crystallize it using the catalyst element;

forming a gate electrode on said semiconductor film;

introducing a doping impurity into a portion of said semiconductor film with said gate electrode as a mask;

forming a substance containing a catalyst element in contact with the portion of said semiconductor film; and annealing said semiconductor film at a second temperature lower than the first temperature to crystallize the portion of the semiconductor film and to activate said introduced impurity.

2. The method of claim 1 wherein said adding step is carried out by forming a substance containing the catalyst element is contact with said semiconductor film, and thereafter thermally combining said catalyst element with said semiconductor film.

3. The method of claim 2 wherein said substance is a compound of said catalyst element and silicon.

4. The method of claim 1 wherein the semiconductor film into which the impurity is introduced includes a channel layer and source and drain regions, and a catalyst element concentration of the source and drain region is higher than that of the channel region.

5. A method of forming a transistor comprising:

forming on a substrate a semiconductor film comprising silicon;

adding a catalyst element for promoting crystallization, to said semiconductor film;

annealing the semiconductor film at a first temperature to crystallize it using the catalyst element;

forming a gate electrode on said semiconductor film;

introducing a doping impurity and a catalyst element into a portion of said semiconductor film with said gate electrode as a mask to obtain the portion having a concentration of said catalyst element higher than an another portion of the semiconductor film; and annealing said semiconductor film at a second temperature lower than the first temperature to crystallize the portion of the semiconductor film using the catalyst element and to activate said introduced impurity.

6. The method of claim 5 wherein the semiconductor film includes a channel layer and source and drain regions, and a catalyst element concentration of the source and drain regions is higher than that of the channel region.

7. A method of forming a transistor comprising:

forming on a substrate a semiconductor film comprising silicon;

adding a catalyst element for promoting crystallization, to said semiconductor film;

annealing said semiconductor film at a temperature of $T_1$ to crystallize it using catalyst element;

forming a gate electrode on said semiconductor film;

introducing a doping impurity and a catalyst element into a portion of said semiconductor film with said gate electrode as a mask; and annealing said semiconductor film at a temperature of $T_2$ which is less than the temperature of $T_1$ to crystallize the portion of the semiconductor film using the catalyst element and to activate said introduced impurity.

8. The method of claim 7 wherein $T_1-T_2>50°$ C.

9. The method of claim 7 wherein the semiconductor film includes a channel layer and source and drain regions, and a catalyst element concentration of the source and drain regions is higher than that of the channel region.

10. A method of forming a semiconductor circuit comprising:

selectively forming a substance containing a catalyst element in contact with a semiconductor film comprising silicon;

annealing said semiconductor film at a first temperature to crystallize a portion of said semiconductor film in contact with said catalyst element;

patterning the semiconductor film into at least one amorphous silicon region and at least one crystalline silicon region forming at least one gate electrode on each of said amorphous silicon region and said crystalline silicon region;

introducing an impurity and a catalyst element into the crystalline silicon region with the gate electrode as a mask; and annealing the crystalline silicon region at a second temperature lower than the first temperature to crystallize a portion of the crystalline silicon region into which the impurity is introduced using the catalyst element and to activate the introduced impurity.

11. The method of claim 10 wherein said annealing step is carried out at the first temperature of 580° C. or lower.

12. The method of claim 10 wherein the semiconductor film includes a channel layer and source and drain regions, and a catalyst element concentration of the source and drain regions is higher than that of the channel region.

13. A method of forming a semiconductor circuit comprising:

introducing a catalyst element into a semiconductor film comprising silicon;

annealing said semiconductor film at a first temperature to crystallize a portion of said semiconductor film into which said catalyst element is introduced;

patterning the semiconductor film into at least one amorphous silicon region and at least one crystalline silicon region;

forming at least one gate electrode on each of said amorphous silicon region and said crystalline silicon region;

introducing an impurity and a catalytic element into the crystalline silicon region with the gate electrode as a mask; and annealing the crystalline silicon region at a second temperature lower than the first temperature to crystallize a portion of the crystalline silicon region into which the impurity is introduced and to activate the introduced impurity.

14. The method of claim 13 wherein said annealing step is carried out at the first temperature of 580° C. or lower.

15. A method for forming a semiconductor device comprising the steps of:

forming on a substrate having an insulating surface a semiconductor film comprising silicon;

introducing a catalyst element into the semiconductor film;

annealing the semiconductor film at a first temperature to crystallize it using the catalyst element;

forming a gate electrode and an insulating film on the crystallized semiconductor film;

introducing an impurity into the crystallized semiconductor film with the gate electrode as a mask to form a semiconductor film including a channel region and source and drain regions;

doping with a catalyst element the source and drain regions into which the impurity is introduced; and annealing the semiconductor film into which the catalyst element is doped at a second temperature lower than the first temperature to crystallize the semiconductor film using the catalyst element and to activate the introduced impurity, wherein the catalyst element concentration of the source and drain regions is higher than that of the channel region, 16. The method of claim 15 wherein the catalyst element includes nickel.

\* \* \* \* \*